(12) United States Patent
Burkholder et al.

(10) Patent No.: US 10,268,940 B2
(45) Date of Patent: Apr. 23, 2019

(54) STRETCHABLE BROAD IMPEDANCE BANDWIDTH RFID DEVICES

(71) Applicant: OHIO STATE INNOVATION FOUNDATION, Columbus, OH (US)

(72) Inventors: Robert J. Burkholder, Gallway, OH (US); Asimina Kiourti, Columbus, OH (US); Shuai Shao, Columbus, OH (US); John L. Volakis, Columbus, OH (US)

(73) Assignee: OHIO STATE INNOVATION FOUNDATION, Columbus, OH (US)

( * ) Notice: Subject to any disclaimer, the term of this patent is extended or adjusted under 35 U.S.C. 154(b) by 0 days.

(21) Appl. No.: 15/516,229

(22) PCT Filed: Sep. 29, 2015

(86) PCT No.: PCT/US2015/052811
§ 371 (c)(1),
(2) Date: Mar. 31, 2017

(87) PCT Pub. No.: WO2016/053951
PCT Pub. Date: Apr. 7, 2016

(65) Prior Publication Data
US 2017/0308782 A1 Oct. 26, 2017

Related U.S. Application Data

(60) Provisional application No. 62/058,160, filed on Oct. 1, 2014.

(51) Int. Cl.
*H01Q 1/27* (2006.01)
*H05K 1/02* (2006.01)
(Continued)

(52) U.S. Cl.
CPC ....... *G06K 19/0726* (2013.01); *G06K 19/077* (2013.01); *G06K 19/07786* (2013.01);
(Continued)

(58) Field of Classification Search
None
See application file for complete search history.

(56) References Cited

U.S. PATENT DOCUMENTS

2004/0036572 A1* 2/2004 Forster ............... B60C 23/0433
340/5.61
2004/0056823 A1 3/2004 Zuk et al.
(Continued)

FOREIGN PATENT DOCUMENTS

WO 2010071574 A1 6/2010

OTHER PUBLICATIONS

International Search Report and Written Opinion of the International Searching Authority, Application No. PCT/US2015/052811, dated Dec. 23, 2015, 9 pages.

*Primary Examiner* — Howard Williams
(74) *Attorney, Agent, or Firm* — Meunier Carlin & Curfman LLC

(57) ABSTRACT

According to the embodiments described herein, a stretchable RFID device can include an RFID chip and an RFID antenna. The RFID antenna can be electrically coupled and mechanically attached to the RFID chip. The RFID antenna can be impedance matched to the RFID chip across a broad bandwidth and can include two arms. Each of the two arms can include an end-loading body that at least partially surrounds an end-loading orifice. The end-loading body can stretch without consuming the end-loading orifice.

18 Claims, 10 Drawing Sheets

(51) Int. Cl.
*G06K 19/07* (2006.01)
*H01L 21/84* (2006.01)
*G06K 19/077* (2006.01)

(52) U.S. Cl.
CPC ............... *H01L 21/84* (2013.01); *H01Q 1/27* (2013.01); *H05K 1/0283* (2013.01); *H05K 2201/10098* (2013.01)

(56) References Cited

U.S. PATENT DOCUMENTS

| | | |
|---|---|---|
| 2006/0054710 A1 | 3/2006 | Forster et al. |
| 2007/0171074 A1 | 7/2007 | Camp et al. |
| 2007/0200705 A1* | 8/2007 | Yamagajo ........... G06K 19/0726 340/572.7 |
| 2009/0201156 A1* | 8/2009 | Kato ................ G06K 19/07749 340/572.5 |
| 2014/0118201 A1 | 5/2014 | Im et al. |
| 2016/0072188 A1* | 3/2016 | Alkhateeb ................ H01Q 1/38 343/749 |

* cited by examiner

STRETCHABLE BROAD IMPEDANCE BANDWIDTH RFID DEVICES

RELATED APPLICATIONS

This application is a national stage application filed under 35 U.S.C. § 371 of PCT/US2015/052811 filed Sep. 29, 2015, which claims priority to U.S. Provisional Patent Application No. 62/058,160 filed Oct. 1, 2014, the entirety of which is hereby incorporated by reference.

TECHNICAL FIELD

The present specification generally relates to RFID devices and, more specifically, to stretchable RFID devices with broad impedance bandwidth.

BACKGROUND

Passive UHF RFID (Radio Frequency Identification) systems have been developed for use with automated inventory tracking and item identification. However, available RFID systems do not function well when used in the presence of materials having variable characteristics. For example, changes in dielectric constant can cause a specifically designed RFID system to be detuned. Further, RFID systems can be sensitive to antenna deformation when exposed to changes in pressure, stress and temperature. Therefore, existing RFID systems have failed or had very poor performance in environments of varying pressure, stress and temperature.

Accordingly, a need exists for alternative stretchable RFID devices that provide a broad impedance bandwidth.

SUMMARY

According to the embodiments described herein, stretchable RFID devices can be provided with broad impedance bandwidth to operate in a variety of dielectric varying environments and embedded material configurations that change over time.

In one embodiment, a stretchable RFID device can include an RFID chip and an RFID antenna. The RFID antenna can be electrically coupled and mechanically attached to the RFID chip. The RFID antenna can be impedance matched to the RFID chip across a broad bandwidth and can include two arms. Each of the two arms can include an end-loading body that at least partially surrounds an end-loading orifice. The end-loading body can stretch without consuming the end-loading orifice.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
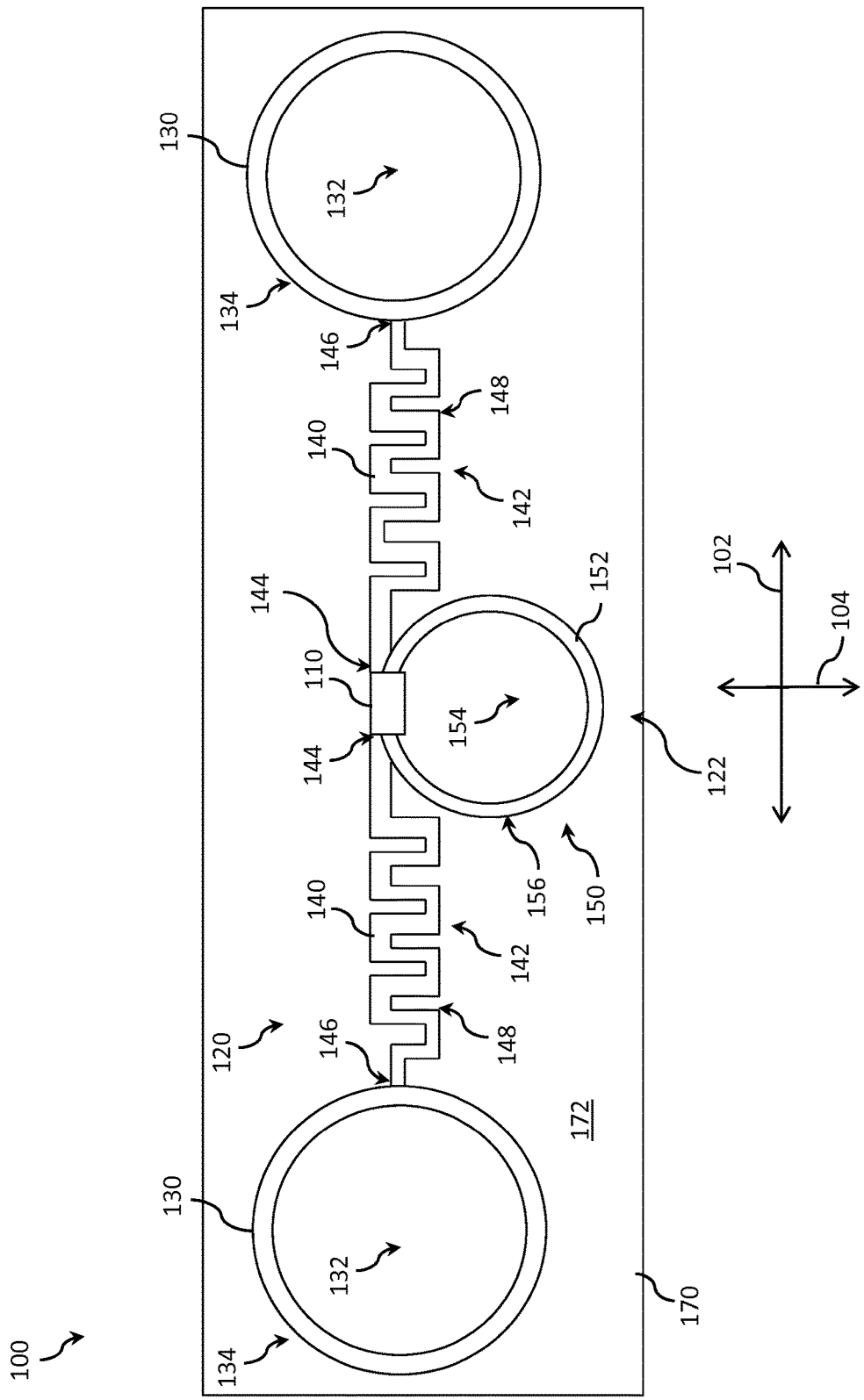
FIGS. 1-4 schematically depict stretchable RFID devices according to one or more embodiments shown and described herein.

FIG. 1 generally depicts one embodiment of a stretchable radio frequency identification (RFID) device that provides a broad impedance bandwidth for communication in the vicinity of a wide range of dielectric materials. As used herein the term "broad" when used to modify the term "bandwidth" can mean that a range of frequency of operation is greater than about 75 MHz. The stretchable RFID device generally comprises an RFID chip that communicates stored data, and an RFID antenna that is impedance matched to the chip for transmitting and receiving electromagnetic signals. Various embodiments of the stretchable RFID device and the operation of the stretchable RFID device will be described in more detail herein.

Referring collectively to FIGS. 1-4, an embodiment of the stretchable RFID device 100 is schematically depicted. The stretchable RFID device 100 can comprise an RFID chip 110 for storing information and providing the stored information in response to a received electrical signal. Exemplary devices that can be utilized as the RFID chip 110 include passive UHF RFID devices that comply with EPCglobal UHF Class 1 Generation 2 such as, for example, the G2X family of RFID devices by NXP Semiconductors of San Jose, Calif., U.S.A. The RFID chip 110 can comprise a circuit for signal processing that can be connected to an antenna to wireless transmit its stored data when externally interrogated by an RFID reader. In addition to storing information, the RFID chip 110 can be configured to modulate and demodulate received signals and to collect power from signals received by the integral antenna. Accordingly, the RFID chip 110 can be configured as a passive RFID system that collects power from incident signals and emits the stored information encoded in an output signal. In some embodiments, the RFID chip 110 can be configured to receive incident signals and emit output signals at a predefined radio frequency bandwidth such as, for example, between about 865 MHz to about 868 MHz in one embodiment, or between about 900 MHz to about 928 MHz in another embodiment.

The stretchable RFID device 100 can comprise an RFID antenna 120 that is configured as a chip impedance matched antenna for extending the operating range of the RFID chip 110. For example, the operating range of the RFID chip 110 can be characterized by the read range, i.e., the maximum distance, measured from the RFID chip 110, from which the output signal of the RFID chip 110 can be detected by a reader. The read range can be dependent upon a power reflection coefficient of the RFID chip 110, which characterizes the proportion of power from the incident signals that can be utilized by the RFID chip 110. The RFID antenna 120 can match the impedance of the RFID chip 110 for example, as measured from antenna terminals of the RFID chip 110 to improve the power reflection coefficient of the RFID chip 110.

Referring collectively to FIGS. 1-4, the RFID antenna 120 can comprise an end-loading body 130 for increasing the impedance bandwidth of the RFID antenna 120. The end-loading body 130 can define a contour that at least partially surrounds an end-loading orifice 132. In some embodiments, the end-loading body 130 can completely surround the end-loading orifice 132. Alternatively, the end-loading body 130 can be provided with gaps such that the end-loading body 130 only partially surrounds the end-loading orifice 132. The end-loading body 130 can be configured to define any contour that can be stretched without consuming the end-loading orifice 132. Accordingly, while the end-loading body 130 is depicted in FIG. 1 as defining a substantially circular contour 134, the end-loading body 130 can define a substantially diamond shaped contour 136 (FIG. 2), a semi-circular contour 138 (FIG. 3), a substantially elliptical shaped contour, or any other contour without sharp corners that can operate as a crack initiation site.

The end-loading body 130 can be formed from conductive material. For example, the conductive material can take the form of wire, stranded cords, fiber or the like. The conductive materials can be of relatively low DC resistance such as, for example, less than about 4.0 Ω/ft in one embodiment, between about 0.25 Ω/ft and about 3.0 Ω/ft in another embodiment, between about 0.5 Ω/ft and about 2.0 Ω/ft in a further embodiment. The conductive material should also exhibit suitable amounts of flexibility and tensile strength to promote stretching and durability. Suitable conductive materials include metallic wire such as, for example, copper wire (e.g., 20 AWG or 24 AWG), or metal clad fiber (also referred to as "E-fiber"), which may be formed from a high strength fiber coated with metal such as, for example, gold, copper, silver, or the like. Metal clad fiber may be preferred for use in harsh environments, as the metal clad fiber can exhibit high tensile strength, flexibility, and a very low resistance. Some embodiments have been formed from 664 filaments and 332 filaments of Amberstrand® fiber by Syscom Advanced Materials, Inc. of Columbus, Ohio, U.S.A.

The RFID antenna 120 can comprise a meander line 140 for reducing the physical size of the RFID antenna 120. Alternatively or additionally, the meander line 140 can be configured to improve bending ease for the RFID antenna 120. As such, the RFID antenna 120 can become less susceptible to failure due to exterior mechanical forces. In some embodiments, the meander line 140 can form a sinuous path that repeats multiple undulations 142 between an interior end 144 and a distal end 146 of the meander line 140. Accordingly, the meander line 140 can pack a relatively long length into a relatively short span. It is noted that, while the meander line 140 is depicted in FIG. 1 as forming the sinuous path via undulations 142 having sharp turns 148, the meander line 140 can form the sinuous path via undulations 142 having gradual turns 149 as depicted, for example, in FIGS. 2 and 3. The meander line 140 can be formed from conductive material. For example, the meander line 140 can be formed from the same conductive material as the end-loading body 130.

Referring still to FIGS. 1-4, the RFID antenna 120 can comprise a tuning circuit 150 for tuning the impedance of the RFID antenna 120 to match the impedance of the RFID chip 110. For example, the tuning circuit 150 can be utilized to compensate for other components of the RFID antenna 120 such as, for example, the end-loading body 130 and the meander line 140. The tuning body 152 can provide sufficient inductance such that the impedance of the RFID antenna 120 is the complex conjugate of the impedance of the RFID chip 110. Alternatively or additionally, the tuning circuit 150 can comprise an integrated circuit for providing inductive elements, capacitive elements, or combinations thereof. For example, the tuning circuit 150 can be provided using a commercially available lumped-element circuit.

In some embodiments, the tuning circuit 150 can comprise a tuning body 152 that defines a contour that at least partially surrounds a tuning orifice 154. The tuning body 152 can be configured to define any contour that can be stretched without consuming the tuning orifice 154. For example, the tuning body 152 can define a substantially circular contour 156 (FIG. 1), a substantially diamond shaped contour 158 (FIG. 2), a substantially elliptical shaped contour 160 (FIG. 3), or any other contour without sharp corners that can operate as a crack initiation site.

Figure 5:
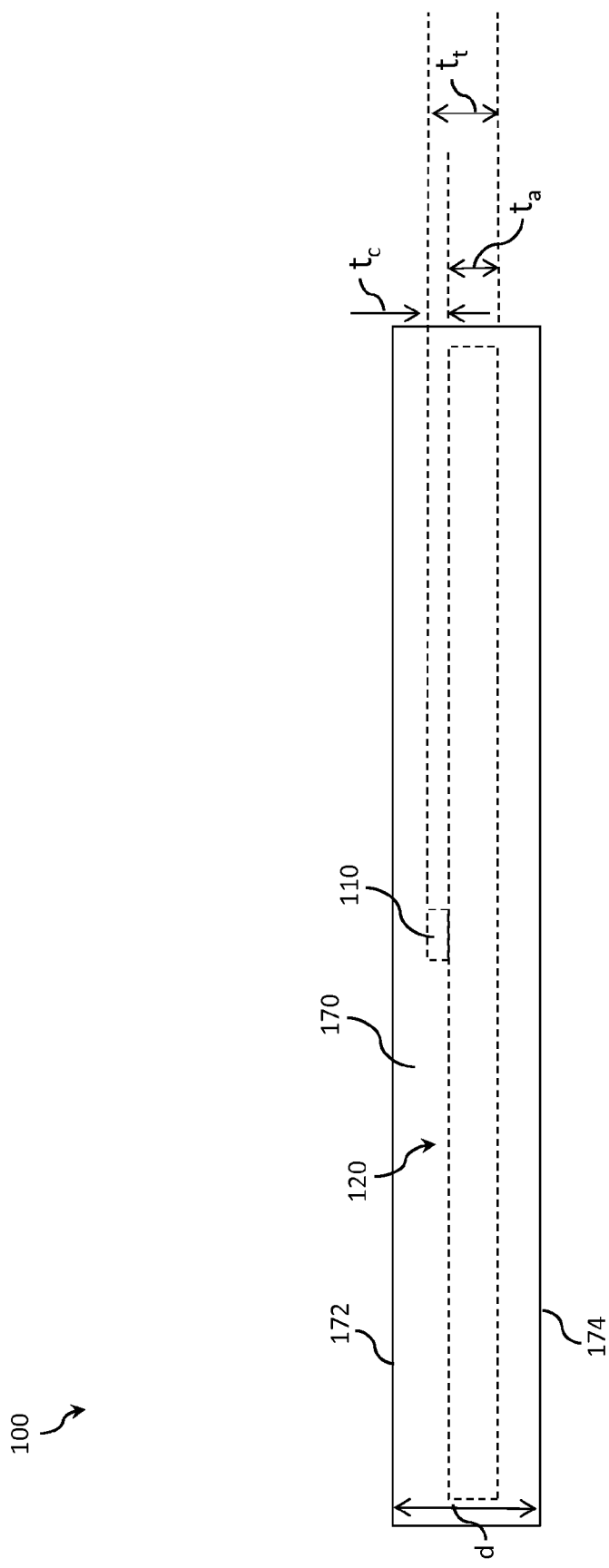
FIG. 5 schematically depicts a side view of the stretchable RFID device of FIG. 1 according to one or more embodiments shown and described herein.

Referring collectively to FIGS. 1 and 5, the stretchable RFID device 100 can be provided with a substantially planar topology, i.e., the stretchable RFID device 100 can be a relatively thin object for mounting on surfaces or between layers of materials. In some embodiments, the stretchable RFID device 100 can comprise a tag member 170 for improving the mechanical integrity of the stretchable RFID device 100 and facilitating integration of the stretchable RFID device 100 with objects such as, for example, tires, air springs, or wearable devices. The tag member 170 can be demarcated by a first surface 172 and a second surface 174 that are offset by a relatively small distance d. In some embodiments, the distance d can be less than or equal to about 10 mm such as, for example, less than or equal to about 8 mm in one embodiment, less than or equal to about 4 mm in another embodiment, or less than or equal to about 2 mm in a further embodiment.

The tag member 170 can be formed from any stretchable (e.g., elastomeric) material such as, for example, silicone-based polymer (e.g., Polydimethylsiloxane), natural or synthetic rubber, fabric (e.g., spandex or Lycra), or the like. The tag member 170 can also be formed from uncured rubber, i.e., unvulcanized rubber or green rubber. Additionally, the stretchable material of the tag member 170 can have a relative dielectric permittivity that is matched to an object with which the stretchable RFID device 100 is intended to be integrated. For example, the tag member 170 can have any relative dielectric permittivity greater than about 1 and less than about 100, such as, for example, any relative dielectric permittivity between about 2 to about 30 in one embodiment, any relative dielectric permittivity between about 2.25 and about 17 in another embodiment, or any relative dielectric permittivity between about 3 and about 13 in a further embodiment. In some embodiments, the stretchable material can be doped with another material to achieve the desired relative dielectric permittivity. For example, in some embodiments, polymers can be doped with dispersed ceramic material to set the dielectric permittivity.

Referring collectively to FIGS. 1-4, embodiments of the RFID antenna 120 can be classified as an end-loaded meander line dipole antenna. Specifically, the RFID antenna 120 can comprise two arms each comprising an end-loading body 130 that is laterally offset from the RFID chip 110, i.e., offset with respect to a lateral direction 102. Each end-loading body 130 can be mechanically attached and electrically coupled to the meander line 140 at the distal end 146 of the meander line 140. Accordingly, end-loading body 130 can provide a load at the distal end 146 of the meander line 140 and broaden the impedance bandwidth of the RFID antenna 120. As is noted above, the end-loading body 130 can be provided with gaps such that the end-loading body 130 only partially surrounds the end-loading orifice 132. In such embodiments, it may be preferred to orient the end-loading body 130 such that any gaps are spaced away from the distal end 146 of the meander line 140.

The RFID chip 110 can be substantially centered with respect to the stretchable RFID device 100 and located at a central portion 122 of the RFID antenna 120. Generally, the interior end 144 of the meander line 140 can be located relatively close to the RFID chip 110. The meander line 140 can extend away from the RFID chip 110 and the central portion 122 of the RFID antenna 120 and towards the end-loading body 130. Accordingly, the interior end 144 of the meander line 140 can be located relatively close to the RFID chip 110 and relatively distant from the end-loading body 130. Additionally, the distal end 146 of the meander line 140 can be located relatively distant from the RFID chip 110 and relatively close to the end-loading body 130.

As the meander line 140 can extend between the interior end 144 and the distal end 146, the undulations 142 can be formed there between. Accordingly, the length of the meander line 140 located between the interior end 144 and the distal end 146 can be greater that the lateral offset between the end-loading body 130 and the RFID chip 110. In some embodiments, the majority of the length of the meander line 140 formed by the undulations 142 can be oriented substantially orthogonally to the lateral direction 102. It is furthermore noted that the RFID antenna 120 can be characterized by an end-loading ratio given by the ratio of the perimeter of the end-loading body 130 to the length of the path formed by the meander line 140 (i.e., perimeter divided by length). In some embodiments, the end-loading ratio can be greater than or equal to about 0.5 such as, for example, greater than or equal to about 0.75 in one embodiment, or greater than or equal to about 1 in another embodiment. In further embodiments, the end-loading ratio can be between about 0.5 and about 2.5.

Figure 2:
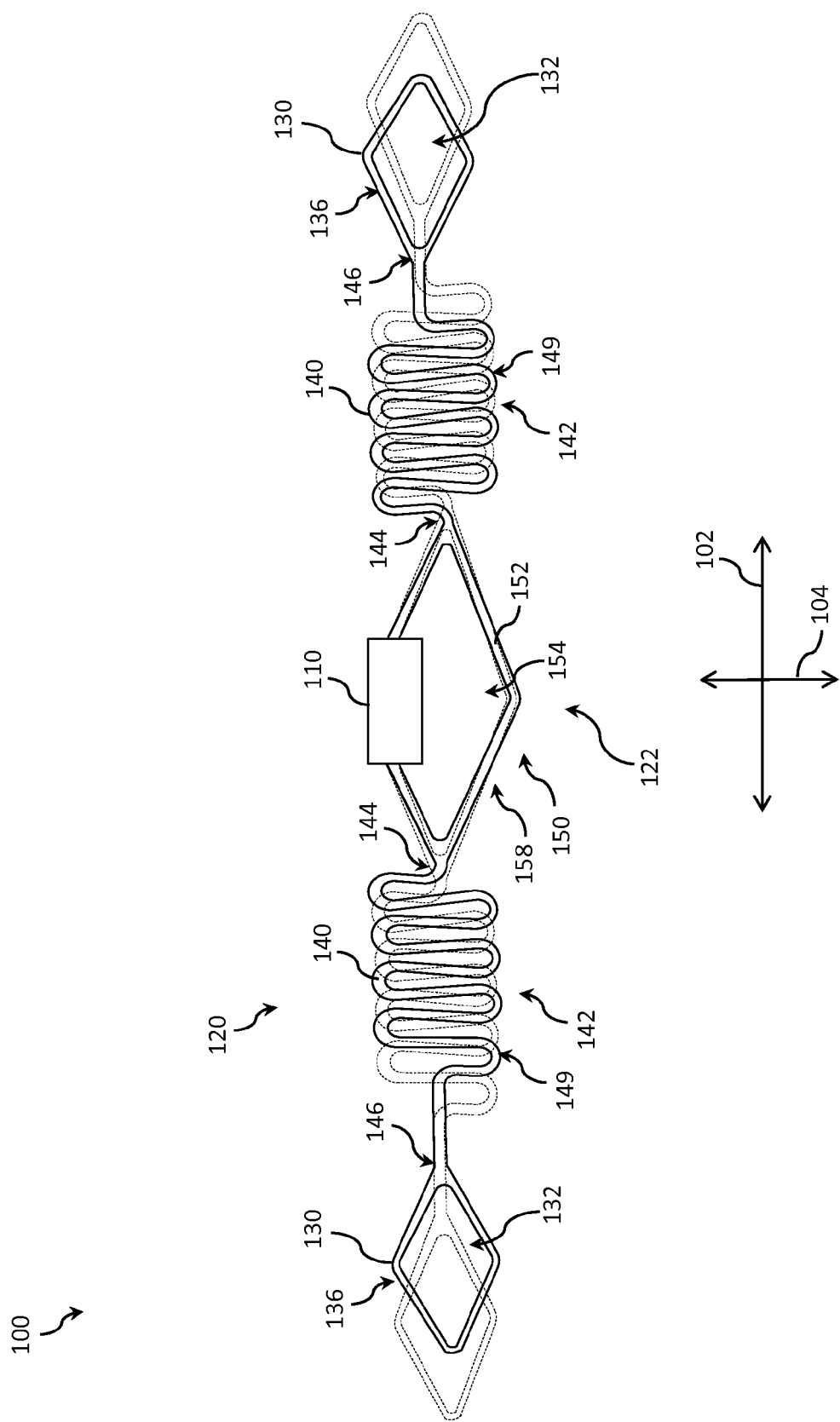
Figure 3:
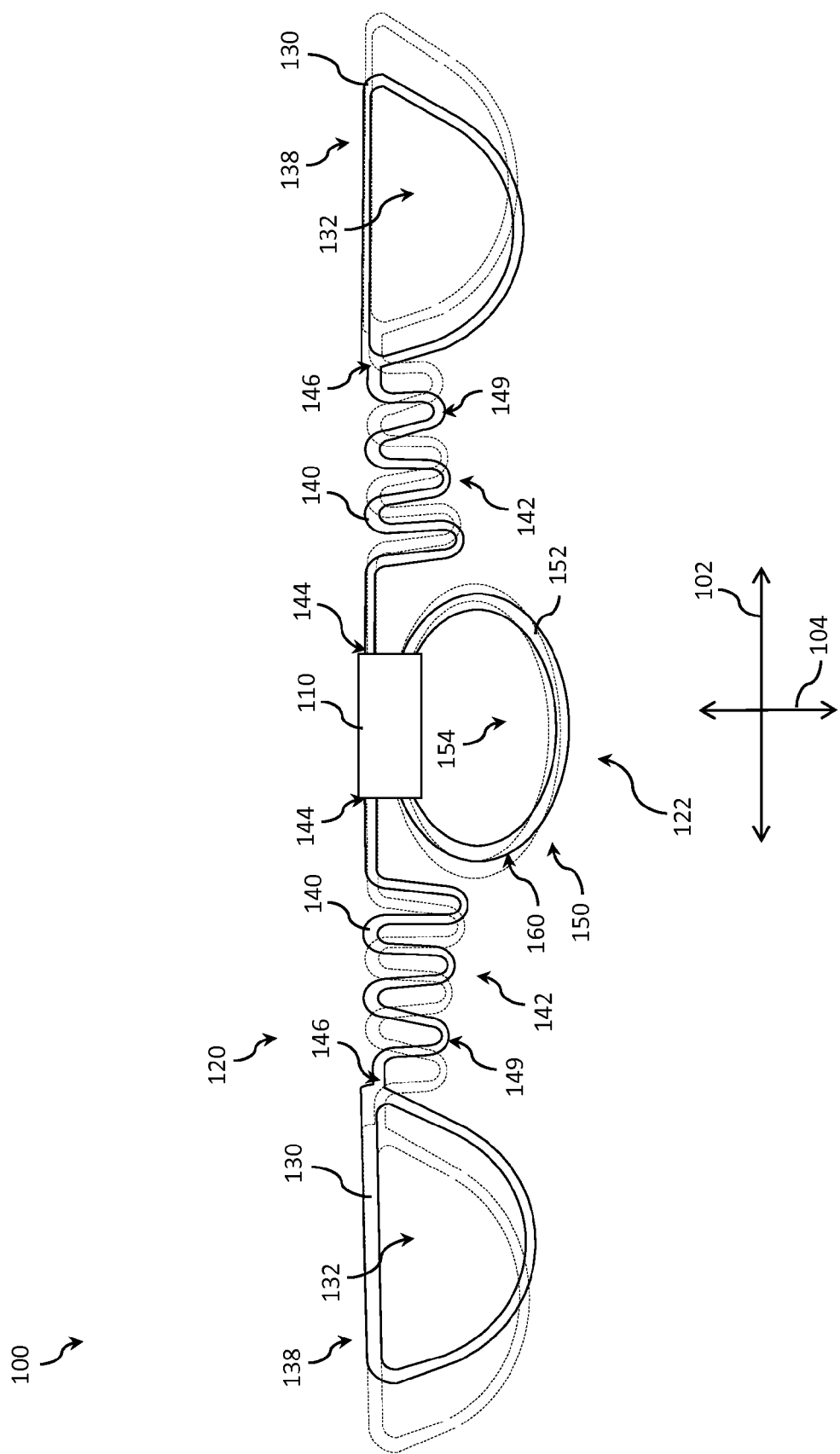
Figure 4:
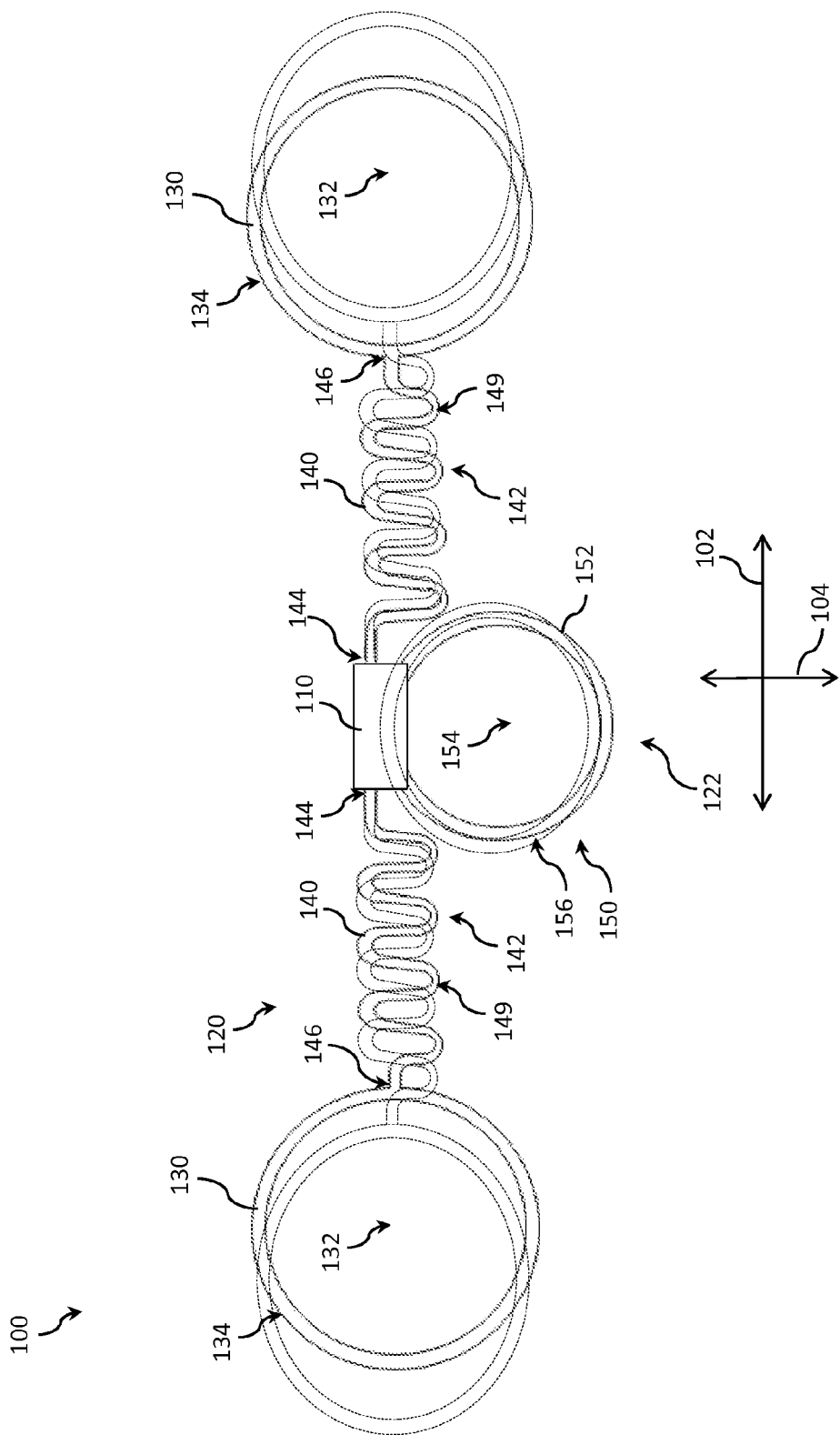

The stretchable RFID device 100 can further comprise a tuning circuit 150 having a tuning body 152 that is located at the central portion 122 of the RFID antenna 120. The tuning body 152 of the tuning circuit 150 can be mechanically attached and electrically coupled to the RFID chip 110. Alternatively or additionally, the tuning body 152 of the tuning circuit 150 can be mechanically attached and electrically coupled to the meander line 140. In some embodiments, the interior end 144 of the meander line 140 can be electrically coupled and mechanically attached to both the tuning body 152 of the tuning circuit 150 and the RFID chip 110 (FIGS. 1, 3 and 4). Alternatively, the interior end 144 of the meander line 140 can be electrically coupled and mechanically attached to the tuning body 152 of the tuning circuit 150 and offset from the RFID chip 110 (FIG. 2). In high stress environments, it may be preferred to mechanically attach the interior end 144 of the meander line 140 to both the tuning body 152 of the tuning circuit 150 and the RFID chip 110 for additional mechanical robustness.

In some embodiments, mechanical attachment and electrical coupling can be performed simultaneously. For example, mechanical attachment and electrical coupling can be achieved through the use of solder connections. It is noted that, the embodiments described herein are not limited to solder connections, mechanical attachment and electrical coupling can be achieved through crimps, electrical connectors, making components integral, or the like. In some embodiments, it may be preferred to mechanically attach the interior end 144 of the meander line 140 to both the tuning body 152 of the tuning circuit 150 and the RFID chip 110 to reduce the number of solder connections, which can improve durability and reduce fabrication costs.

Referring collectively to FIGS. 1 and 5, the RFID chip 110 and the RFID antenna 120 can be embedded within the tag member 170. Specifically, the RFID chip 110 and the RFID antenna 120 can be disposed within the tag member 170 and located between the first surface 172 and the second surface 174 of the tag member 170. In some embodiments, the RFID chip 110 and the RFID antenna 120 can be mechanically attached to one another and characterized by a total thickness $t_t$. The total thickness $t_t$ can be the sum of a thickness $t_c$ of the RFID chip 110 and a thickness $t_a$ of the RFID antenna 120. Accordingly, the distance d between the first surface 172 and the second surface 174 of the tag member 170 can be greater than the total thickness $t_t$. In some embodiments, the distance d between the first surface 172 and the second surface 174 of the tag member 170 can be set such that each of the RFID chip 110 and the RFID antenna 120 are covered by at least a predetermined thickness of the tag member 170. In some embodiments, the predetermined thickness can be between about 0.5 mm and about 2 mm such as, for example about 1 mm in another embodiment. Alternatively or additionally, the first surface 172 and the second surface 174 of the tag member 170 can be substantially flat.

Referring collectively to FIGS. 2-4, embodiments of the stretchable RFID device 100 can be configured for stretching in any direction in plane with the RFID antenna 120. For example, the RFID antenna 120 can be configured to stretch along the lateral direction 102. Specifically, in response to a force that urges each end-loading body 130 away from the other, the RFID antenna 120 can deform into a stretched configuration (generally indicated in FIGS., 2-4 as dashed lines). In the stretched configuration, the end-loading orifice 132 can be increased laterally and reduced vertically, i.e., along the orthogonal direction 104. The end-loading body 130 can be configured to define any contour such that, when in the stretched configuration, the end-loading orifice 132 is not consumed, i.e., no portion of the end-loading body 130 crosses the end-loading orifice 132 to make contact with another portion of end-loading body 130. Similarly, when in the stretched configuration, the tuning orifice 154 can be increased laterally and reduced vertically without being consumed by the tuning body 152. When in the stretched configuration, the meander line 140 can be stretched to increase the lateral offset between each end-loading body 130. Specifically, the undulations 142 of the can be flattened such that the gradual turns 149 become more obtuse to accommodate the deformation. It is noted that, while the stretchable RFID device 100 is depicted in FIGS. 2-4 as being stretched in the lateral direction 102, the embodiments described herein may be stretched in any direction, twisted, or curled.

Accordingly, embodiments of the stretchable RFID device 100 can be utilized in applications that result in deformation of the stretchable RFID device 100 such as, for example, tires or air springs. Indeed, embodiments of the stretchable RFID device 100 have been demonstrated to continue to operate even when stretched up to about 20%. Specifically, the RFID antenna 120 can maintain good electrical performance after being stretched more than about 20%.

Figure 6:
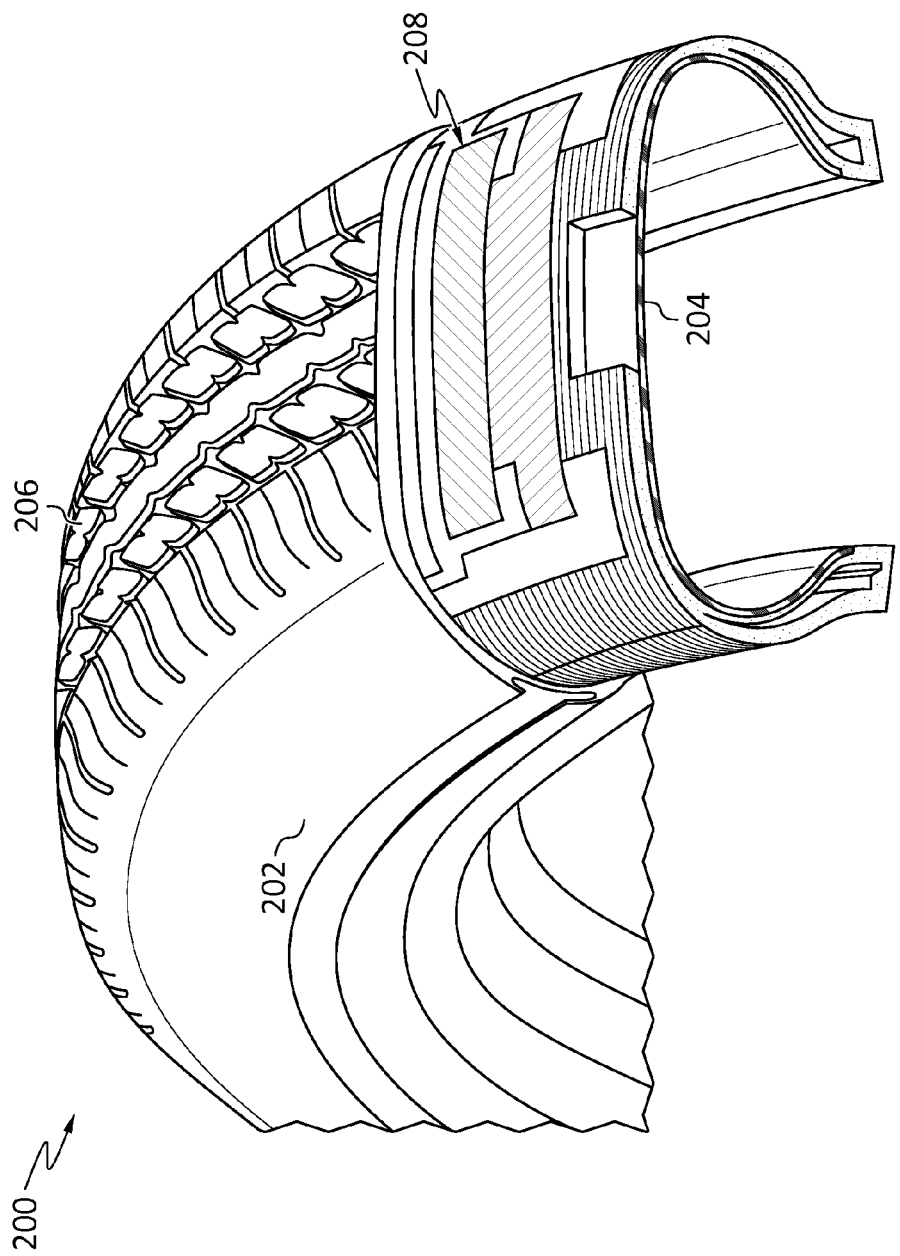
FIG. 6 schematically depicts a partial cut-away view of a tire according to one or more embodiments shown and described herein.

Referring collectively to FIGS. 1 and 6, the stretchable RFID device 100 can be integrated with a tire 200. In some embodiments, the stretchable RFID device 100 can be attached to the tire 200 after manufacture. For example, the stretchable RFID device 100 can be adhered to a side wall 202, inner liner 204, or both. Since the stretchable RFID device 100 can be configured for stretching in any direction without losing electrical performance, the stretchable RFID device 100 can be interposed during manufacture of the tire 200 between the side wall 202, the inner liner 204, tread 206, or other intervening layers 208 such as, but not limited to, body plies, bead bundles, bead fillers, stabilizer plies, under tread or the like. Specifically, the tire 200 can be assembled by laying up the side wall 202, the inner liner 204, the tread 206, and other intervening layers 208 according to a predetermined order to form a green tire. After the green tire is formed, the green tire can be expanded and cured within a mold to form the tire 200. Since the stretchable RFID device 100 can be stretched without degrading performance, the stretchable RFID device 100 can be interposed between layers of the green tire during manufacture of the tire 200.

Figure 7:
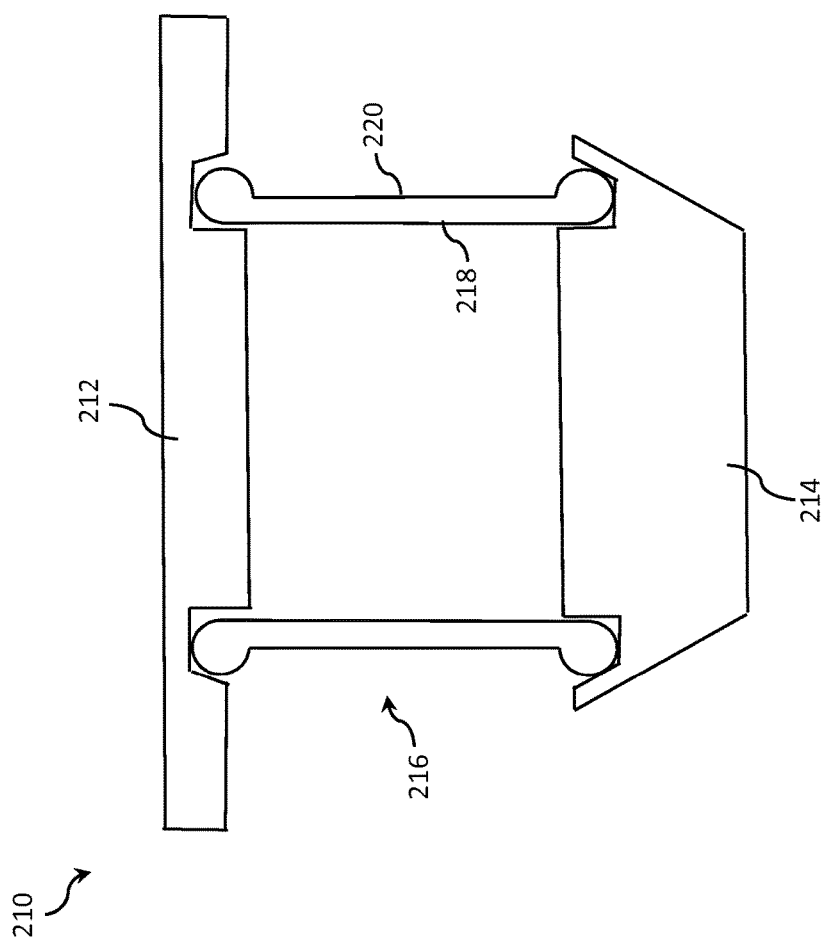
FIG. 7 schematically depicts a cross-sectional view of an air spring according to one or more embodiments shown and described herein.

Referring collectively to FIGS. 1 and 7, the stretchable RFID device 100 can be integrated with an air spring 210. The air spring 210 can comprise an upper saddle plate 212 and a lower saddle plate 214 with an air bellows 216 configured to maintain a pressurized fluid and flex in order to mitigate relative motion between the upper saddle plate 212 and the lower saddle plate 214. The air bellows 216 can comprise an interior wall 218 that interfaces with the pressurized fluid and an exterior wall 220 that can be exposed to an ambient environment such as, for example, an undercarriage of a vehicle. In some embodiments, the stretchable RFID device 100 can be attached to the air spring 210 after manufacture. For example, the stretchable RFID device 100 can be adhered to the interior wall 218 of the air bellows 216, the exterior wall 220 of the air bellows 216, or both. The air bellows 216 can be manufactured in a manner analogous to the tire 200 (FIG. 6), i.e., formed by curing a green body having a plurality of layers. Accordingly, the stretchable RFID device 100 can be interposed during manufacture of the air spring 210 between layers of the air bellows 216.

Figure 8:
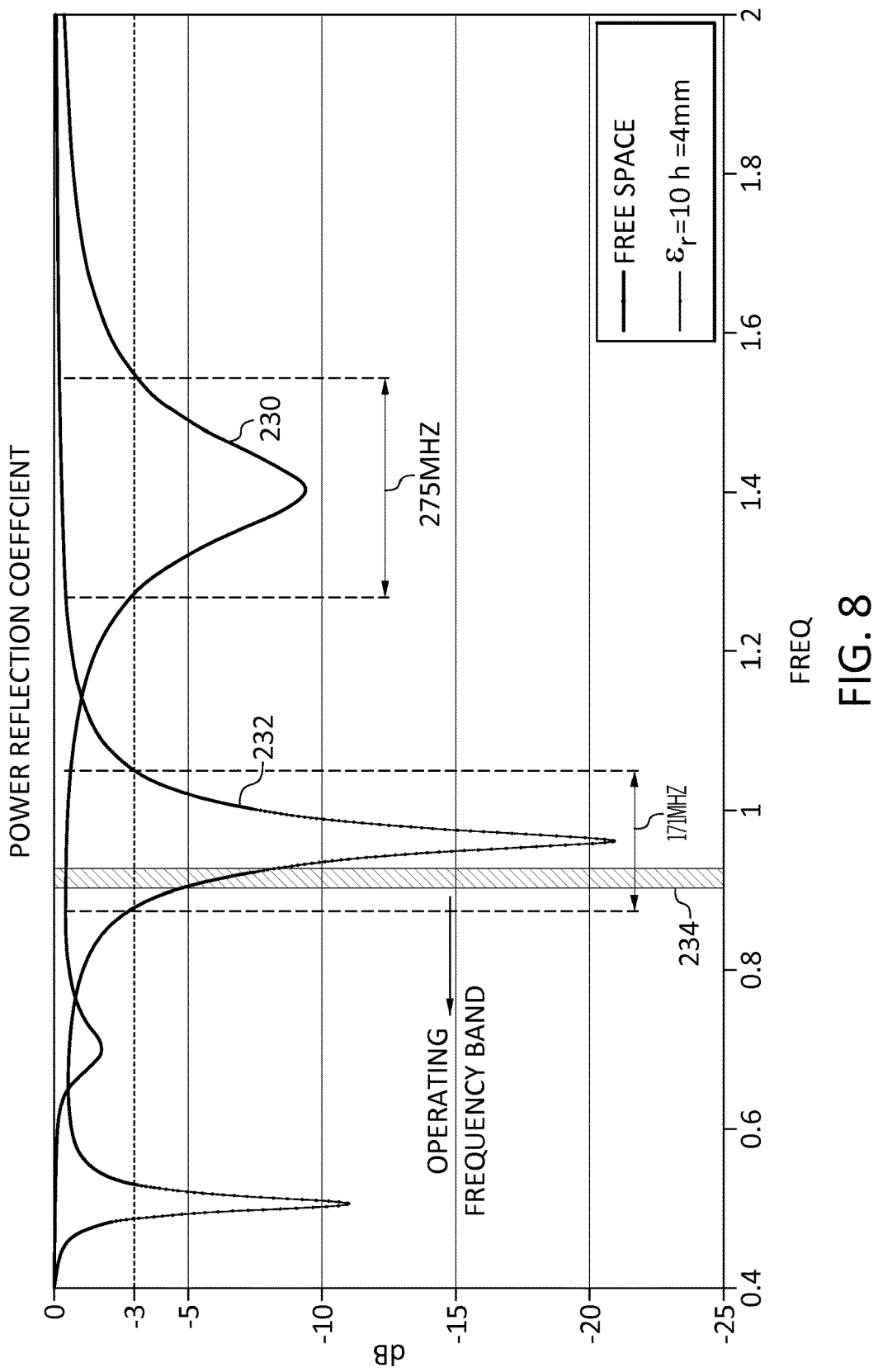
FIG. 8 graphically depicts a power reflection coefficient of a stretchable RFID device according to one or more embodiments shown and described herein.

Referring collectively to FIGS. 1, 5 and 8, embodiments of the stretchable RFID device 100 have been evaluated using the power reflection coefficient between the RFID chip 110 and the RFID antenna 120 utilizing computer simulations. The results of the computer simulations are provided graphically in FIG. 8. The free space curve 230 corresponds to a simulation of the RFID chip 110 and the RFID antenna 120 in free space, i.e., without the tag member 170. Curve 232 corresponds to a simulation of a stretchable RFID device 100 mounted on a dielectric slab having a thickness of about 4 mm and encased in a relative dielectric constant of about 10. As demonstrated by curve 232, the stretchable RFID device 100 can be tuned to maintain a good impedance match across an operating frequency band 234 (about 900 MHz to about 928 MHz) with sufficient bandwidth to allow variability in the underlying or surrounding material. Specifically, as demonstrated by the curve 232, the stretchable RFID device 100 can have a broad impedance bandwidth greater than about 100 MHz.

Figure 9:
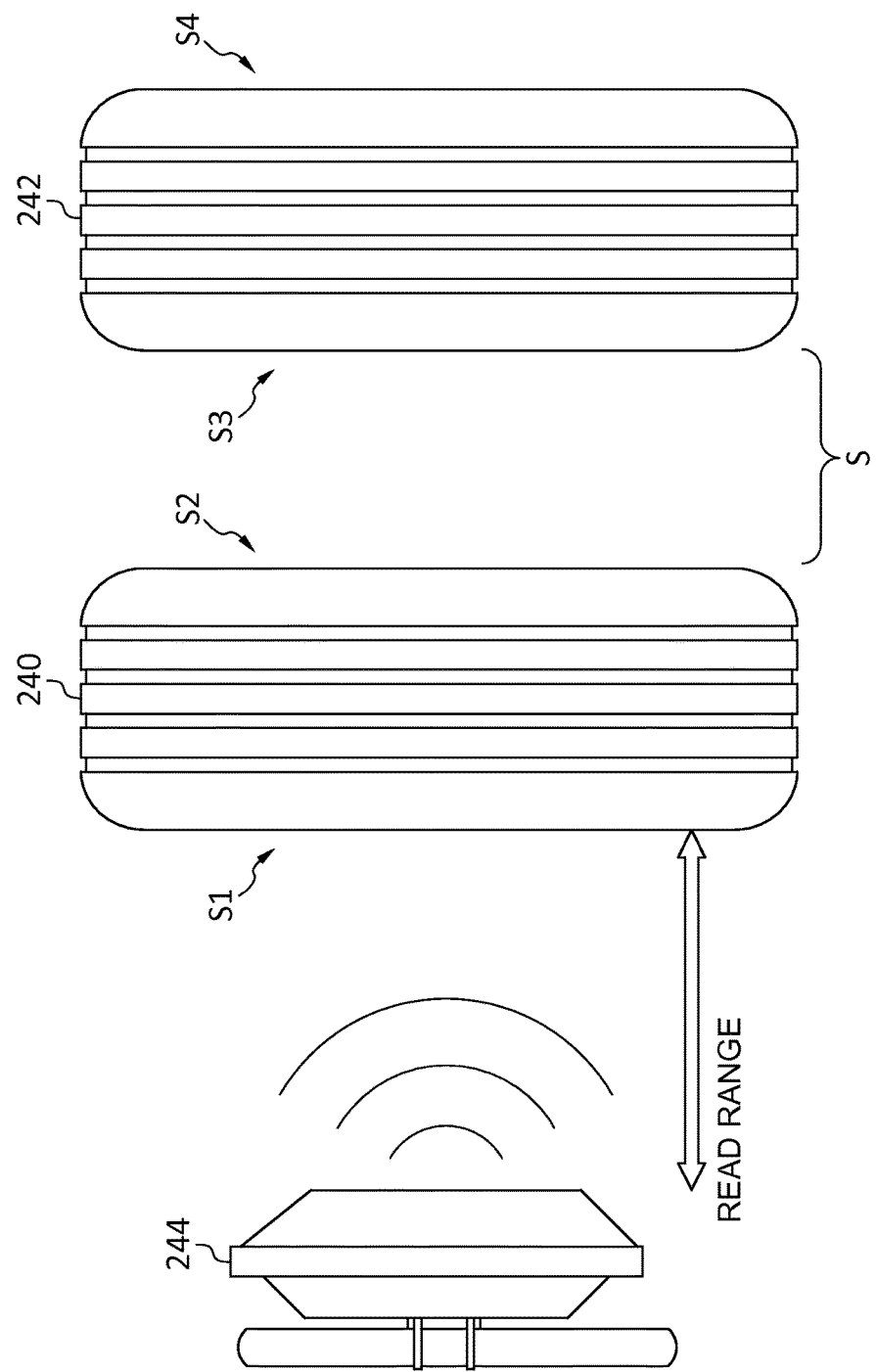
FIG. 9 schematically depicts a read range test according to one or more embodiments shown and described herein.

Referring collectively to FIGS. 1 and 9, embodiments of the stretchable RFID device 100 have been compared to a helical RFID tire tag for read range. Specifically, Comparative Example 1 corresponds to a helical RFID tire tag marketed as Speedy Core by Patch Rubber Company of Weldon, N.C., U.S.A. Comparative Example 1 was compared to an embodiment of the stretchable RFID device 100 with an RFID antenna 120 formed from copper wire and a tag member 170 formed from a polymer (Example 1). Comparative Example 1 and Example 1 were tested for read range when installed at various locations of a first tire 240 and a second tire 242 that were located adjacent to one another and spaced apart by a distance S, wherein S was equal to about 15 cm. Comparative Example 1 and Example 1 were placed at position S1 and position S2 located on an outer surface of the first tire 240 as well as position S3 and position S4 on an outer surface of the second tire 242. Comparative Example 1 and Example 1 were evaluated for read range by an RFID reader 244 offset from the first tire 240. The measured read ranges are summarized below in Table 1. The measured read ranges demonstrate the superior effectiveness of Example 1 as compared to Comparative Example 1 for a truck specific installation.

TABLE 1

|  | Position S1 | Position S2 | Position S3 | Position S4 |
| --- | --- | --- | --- | --- |
| Comparative Example 1 | 4 ft | 0.5 ft | Cannot be read | Cannot be read |
| Example 1 | 13 ft | 8 ft | 4 ft | 4 ft |

Figure 10:
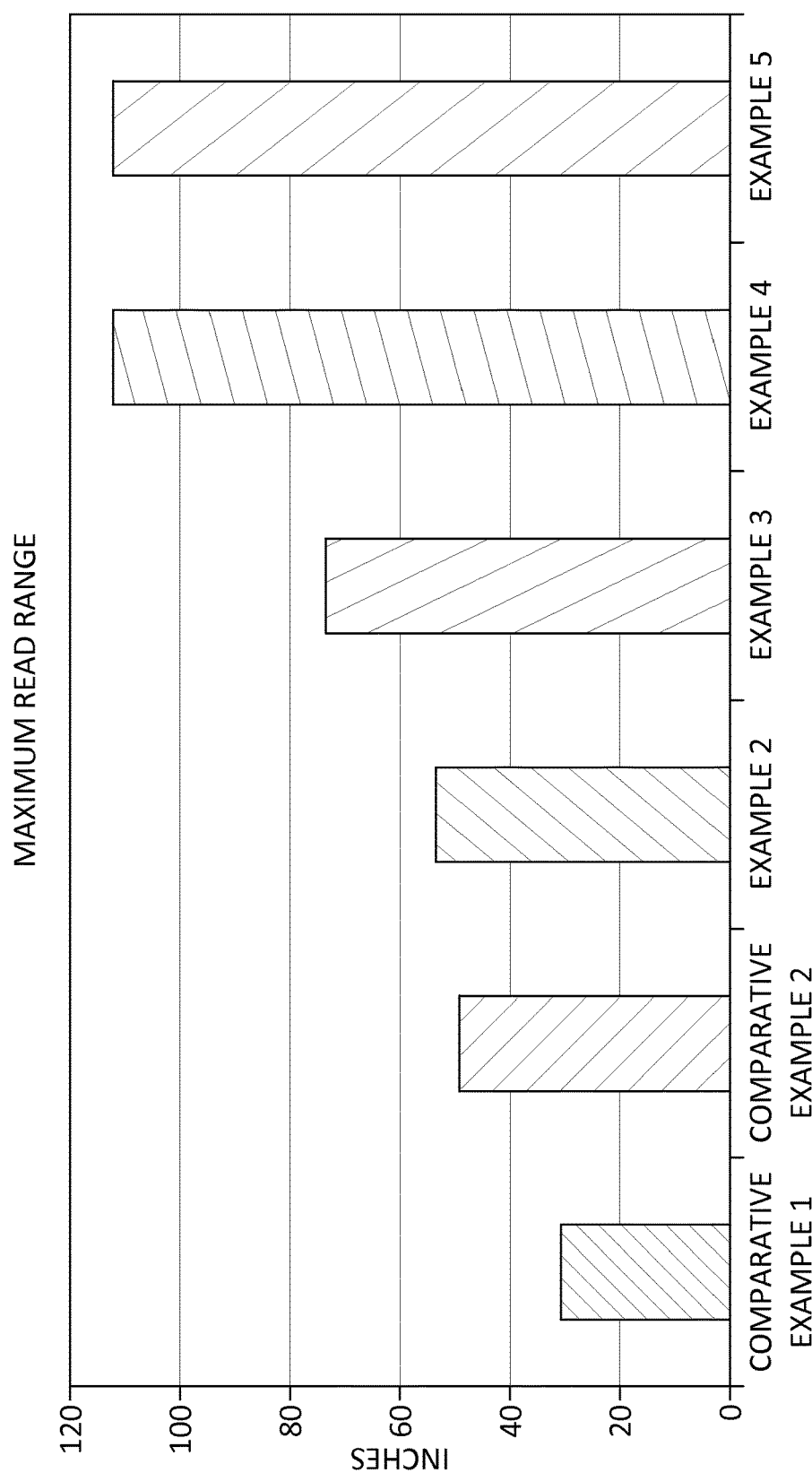
FIG. 10 graphically depicts the results of read range testing according to one or more embodiments shown and described herein.

Referring collectively to FIGS. 1 and 10, embodiments of the stretchable RFID device 100 have been embedded within a tire and compared to a helical RFID tire tag for read range. FIG. 10 summarizes the results of a read range test of the tire embedded RFID tags. Comparative Example 2 was a version of Comparative Example 1 that was modified for improved read range. Example 2 was an embodiment of the stretchable RFID device 100 with the RFID antenna 120 formed from copper wire and a tag member 170 formed from green (uncured) rubber-based, low relative permittivity polymer, i.e., having a relative dielectric permittivity between about 2 to about 30. Example 3 was an embodiment of the stretchable RFID device 100 with an RFID antenna 120 formed from copper wire and a tag member 170 formed from cured Polydimethylsiloxane (silicone-based polymer). Example 4 was an embodiment of the stretchable RFID device 100 with an RFID antenna 120 formed from metal clad fiber and a tag member 170 formed from cured Polydimethylsiloxane (silicone-based polymer). Example 5 was an embodiment of the stretchable RFID device 100 with RFID antenna 120 formed from copper wire and a tag member 170 formed from cured rubber-based, low relative permittivity polymer. FIG. 10 demonstrates the superior read range of the embodiments described herein.

It should now be understood that the embodiments described herein relate to stretchable RFID devices that are flexible and have end-loading that provide a broad impedance bandwidth. The stretchable RFID device has been demonstrated to have increased read range performance, while maintaining flexibility and durability for use in harsh environments. Specifically, the stretchable RFID devices described herein can have broad impedance bandwidth that allows the stretchable RFID device to remain tuned when applied to various or changing dielectric constants. Furthermore, the stretchable RFID devices can endure changes in pressure, stress and temperature, which can lead to antenna deformation. Accordingly, the stretchable RFID devices can be utilized for automotive applications, e.g., integrated with commercial truck tires, air springs, or the like. Therefore, the stretchable RFID devices can be utilized in the provision of tire history and health condition and for the management of replacement, repair or retreading of tires.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A stretchable RFID device comprising:
   an RFID chip; and
   an RFID antenna electrically coupled and mechanically attached to the RFID chip, wherein the RFID antenna is impedance matched to the RFID chip across a broad bandwidth and comprises two arms and two end-loading bodies each electrically-coupled and mechanically attached to a distal end of each of the two arms, said distal end of each arm offset from the RFID chip, wherein each end-loading body comprises a contour without sharp corners having a lateral distance and an orthogonal distance such that the contour at least partially defines an end-loading orifice, and wherein the orthogonal distance of the contour comprising the end-loading body decreases and the lateral distance of the contour comprising the end-loading body increases when the stretchable RFID device is stretched in a lateral direction.

2. The stretchable RFID device of claim 1, wherein each of the two arms comprises a meander line that forms a sinuous path and extends to the distal end of each arm that is offset from the RFID chip.

3. The stretchable RFID device of claim 2, wherein an end-loading ratio is given by a perimeter of the end-loading body divided by a length of the sinuous path formed by the meander line, and wherein the end-loading ratio is greater than or equal to 0.5.

4. The stretchable RFID device of claim 2, wherein the meander line is electrically coupled and mechanically attached to the RFID chip.

5. The stretchable RFID device of claim 1, comprising a tag member that surrounds the RFID chip and the RFID antenna, wherein the tag member has a relative dielectric permittivity greater than about 1 and less than about 100.

6. The stretchable RFID device of claim 5, wherein the tag member has a thickness of less than 10 mm.

7. The stretchable RFID device of claim 5, wherein the tag member comprises an elastomeric material configured to be stretched in the lateral direction or an orthogonal direction.

8. The stretchable RFID device of claim 5, wherein the tag member comprises uncured rubber.

9. The stretchable RFID device of claim 1, comprising a tuning circuit that is electrically coupled and mechanically attached to the RFID chip.

10. The stretchable RFID device of claim 9, wherein the tuning circuit comprises a tuning body that at least partially surrounds a tuning orifice.

11. The stretchable RFID device of claim 10, wherein each of the two arms comprises a meander line that forms a sinuous path, and wherein the meander line is electrically coupled and mechanically attached to the tuning body.

12. The stretchable RFID device of claim 11, wherein the meander line is electrically coupled and mechanically attached to the RFID chip.

13. The stretchable RFID device of claim 1, wherein the RFID antenna has a planar topology.

14. The stretchable RFID device of claim 1, wherein the end-loading body defined the end-loading orifice by completely surrounding the end-loading orifice.

15. The stretchable RFID device of claim 1, wherein the stretchable RFID device is integrated with a tire or an air spring.

16. The stretchable RFID device of claim 1, wherein the broad bandwidth is greater than or equal to 100 MHz.

17. The stretchable RFID device of claim 1, wherein the RFID chip is located at a central portion of the RFID antenna.

18. The stretchable RFID device of claim 1, wherein no portion of the end-loading body crosses the end-loading orifice to make contact with another portion of the end-loading body when the stretchable RFID device is stretched in the lateral direction.

* * * * *